United States Patent [19]

Saitoh

[11] Patent Number: 5,332,692
[45] Date of Patent: Jul. 26, 1994

[54] METHOD OF MANUFACTURING A SEMICONDUCTOR DEVICE HAVING A POLYCIDE STRUCTURE

[75] Inventor: Kenji Saitoh, Itami, Japan

[73] Assignee: Mitsubishi Denki Kabushiki Kaisha, Tokyo, Japan

[21] Appl. No.: 47,632

[22] Filed: Apr. 19, 1993

Related U.S. Application Data

[62] Division of Ser. No. 841,060, Feb. 25, 1992, abandoned.

Foreign Application Priority Data

[30] May 31, 1991 [JP] Japan .................................. 3-129394

[51] Int. Cl.⁵ .......................................... H01L 21/283
[52] U.S. Cl. ................................. 437/193; 437/200;
  437/233; 148/DIG. 19; 148/DIG. 17
[58] Field of Search ............... 437/191, 193, 200, 233;
  257/412; 148/DIG. 19, DIG. 17

[56] References Cited

U.S. PATENT DOCUMENTS

| | | | |
|---|---|---|---|
| 4,329,706 | 5/1982 | Crowder et al. | 257/382 |
| 4,597,163 | 7/1986 | Tsang | 257/384 |
| 4,937,643 | 6/1990 | Deslauriers et al. | 257/409 |
| 5,027,185 | 6/1991 | Liauh | 257/413 |
| 5,130,266 | 7/1992 | Huang et al. | 437/44 |
| 5,168,072 | 12/1992 | Moslehi | 437/41 |
| 5,256,894 | 10/1993 | Shino | 257/388 |
| 5,272,099 | 12/1993 | Chou et al. | 437/41 |

Primary Examiner—T. N. Quach
Attorney, Agent, or Firm—Oblon, Spivak, McClelland, Maier & Neustadt

[57] ABSTRACT

A sputtering technique is conducted within a sputtering device the inside of which is in the state of vacuum, whereby a second polycrystal silicon film (7) is deposited on a first polycrystal silicon film (3) on the surface of which a natural oxide film (4) exists. The inside of the sputtering device is maintained to be in the state of vacuum after the second polycrystal silicon film (7) is formed. With the same sputtering device, a metal silicide film (5) is deposited on the second polycrystal film under vacuum. When a silicon oxide film is formed on the silicide film, silicons to be oxidized are uniformly supplied through the silicide film. Therefore, the polycrystal silicon film and the silicide film are not separated from each other at the boundary face between them. Further, product yield rate is improved since it is not necessary to perform sputter etching.

5 Claims, 6 Drawing Sheets

FIG. 4

| CONDITION | FILM THICKNESS OF SECOND POLYCRYSTAL SILICON FILM 7 | | | CONVENTIONAL PROCESS (WITH SPUTTER ETCHING) | CONVENTIONAL PROCESS (WITHOUT SPUTTER ETCHING) |
|---|---|---|---|---|---|
| | 300Å | 400Å | 500Å | | |
| FILM-SEPARATE CONDITION (BLACK PORTION) | ○ | ○ | ○ | ○ | ◉ |

METHOD OF MANUFACTURING A SEMICONDUCTOR DEVICE HAVING A POLYCIDE STRUCTURE

This is a division of application Ser. No. 07/841,060, filed on Feb. 25, 1992, abandoned.

BACKGROUND OF THE INVENTION

1. Field of the Invention

The present invention relates to a method of manufacturing a semiconductor device, and more particularly, it relates to a method of forming a polycide interconnection.

2. Description of the Prior Art

FIGS. 6 to 9 are cross-sectional views showing main steps of a conventional method of forming a polycide interconnection in a semiconductor device. The manufacturing process will be described below, referring to FIGS. 6 to 9.

Referring to FIG. 6, an interlayer insulating film 2 is formed on a semiconductor substrate 1. A polycrystal silicon film 3 is deposited on the interlayer insulating film 2 by a vacuum CVD technique. At this time, a natural oxide film 4 is formed sparsely on a surface of the polycrystal silicon film 3, as shown in the figure.

Then, the natural oxide film 4 is removed from the surface of the polycrystal silicon film 3 by performing RF etching (sputter etching) with a sputtering device.

After the sputter etching is completed, the sputtering device is employed again in another sputtering process. This time, a metal having a high fusing point such as tungsten silicide, for example, is deposited on the polycrystal silicon film 3, from which the natural oxide film 4 has been removed already, to form a metal silicide film 5, as shown in FIG. 8. Thus, the processings are continuously carried out under vacuum after the sputter etching.

Then, the polycrystal silicon film 3 and the metal silicide film 5 are patterned by performing a photolithography and etching process, thereby a polycide interconnection composed of the polycrystal silicon film 3 and the metal silicide film 5 is formed, as shown in FIG. 9. Further, an interlayer insulating film 6 is formed on the entire surface by a thermal oxidation technique.

A polycide interconnection has been conventionally formed in a semiconductor device as described above. According to the conventional method, it is always necessary to perform the sputter etching in order to remove the natural oxide film 4 which is formed on the surface of the polycrystal silicon film 3. During the sputter etching, a great quantity of particles are produced, which causes deterioration in product yield rate.

On the other hand, when the metal silicide film 5 is formed on the polycrystal silicon film 3 without performing the sputter etching to remove the natural oxide film 4 therefrom, particles are not produced. Therefore, deterioration in product yield rate can be controlled.

In this case, a problem arises when the interlayer insulating film 6 is formed on the metal silicide film 5 by a thermal oxidation technique which involves a heat treatment at a high temperature. When the natural oxide film 4 exists in the boundary face between the polycrystal silicon film 3 and the metal silicide film 5, silicon in the polyrystal silicon film 3 to be oxidixed is not uniformly supplied from the polycrystal silicon film 3 to the surface of the metal silicide film 5. As a result, cavities are produced in the boundary face, and the metal silicide film 5 is separated from the polycrystal silicon film 3 due to the cavities.

SUMMARY OF THE INVENTION

In the first aspect of the present invention, a method of manufacturing a semiconductor device comprises a first step of preparing a semiconductor substrate, a second step of forming a polycrystal silicon film on the semiconductor substrate by a sputtering technique within a predetermined vacuum vessel, and a third step of forming a silicide film on the polycrystal silicon film by a sputtering technique which is carried out within the predetermined vacuum vessel to be continuous with the second step, thereby a polycide structure composed of the polycrystal silicon film and the silicide film is formed.

In the second aspect of the present invention, a method of manufacturing a semiconductor device comprises a first step of preparing a semiconductor substrate, a second step of forming a first polycrystal silicon film on the semiconductor substrate by a CVD technique, a third step of forming a second polycrystal silicon film on the first polycrystal silicon film by a sputtering technique within a predetermined vacuum vessel, and a fourth step of forming a silicide film on the second polycrystal silicon film by a sputtering technique which is carried out within the predetermined vacuum vessel to be continuous with the third step, thereby a polycide structure composed of the first and second polycrystal silicon films and the silicide film is formed.

According to the method of manufacturing a semiconductor device in the first aspect of the present invention, the silicide film is formed on the polycrystal silicon film in the third step by the sputtering technique which is carried out within the predetermined vacuum vessel to be continuous with the second step. The second and third steps are thus continuously conducted under vacuum. Consequently, a natural oxide film is not formed in the boundary face between the polycrystal silicon film and the silicide film.

Even when a silicon oxide film is formed on the silicide film by a thermal oxidation technique, silicon in the polycrystal silicon film supplied uniformly from the polycrystal silicon film through the silicide film. Therefore, the polycrystal silicon film and the silicide film are not separated from each other at the boundary face between them.

Further, it is not necessary to conduct sputter etching in order to remove a natural oxide film, since it is not necessary to remove the natural oxide film. As the sputter etching not required, product yield rate is improved.

According to the method of manufacturing a semiconductor device in the second aspect of the present invention, the silicide film is formed on the second polycrystal silicon film in the fourth step by the sputtering technique which is carried out within the predetermined vacuum vessel to be continuous with the third step. The third and fourth steps are thus continuously conducted under vacuum. Consequently, a natural oxide film is not formed in the boundary face between the second polycrystal silicon film and the silicide film.

The boundary face between the second polycrystal silicon film and the silicide film in accordance with the second aspect has a similar property to the boundary face between the polycrystal silicon film and the silicide film in accordance with the first aspect. Consequently, the second polycrystal silicon film and the silicide film are not separated from each other at the boundary face between them, which improves product yield rate.

In addition, the first polycrystal silicon film is formed under the second polycrystal silicon film by the CVD technique according to the method in the second aspect. Therefore, the layer under the first polycrystal silicon film is not damaged in forming the second polycrystal silicon film.

An object of the present invention is to obtain a method of manufacturing a semiconductor device having a polycide structure wherein a silicide is not separated so as to improve product yield rate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 explanatory shows an effect to be obtained in the preferred embodiment shown in FIGS. 1 to 3;

DESCRIPTION OF THE PREFERRED EMBODIMENTS

Figure 1:
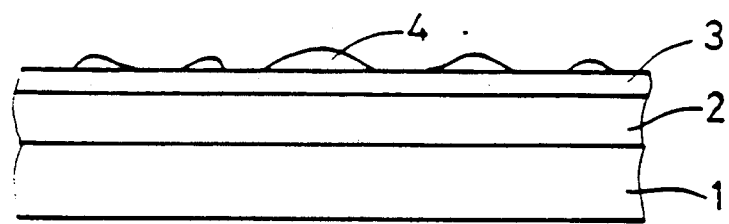
FIG. 1 is a cross-sectional view showing a method of forming a polycide interconnection in a semiconductor device in accordance with a preferred embodiment of the present invention.
Figure 2:
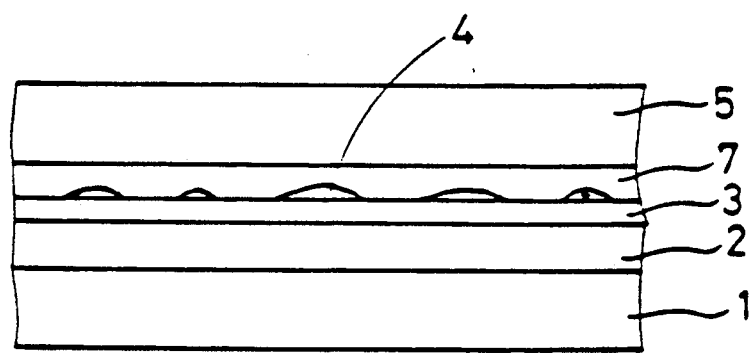
FIG. 2 is a cross-sectional view showing the method of forming a polycide interconnection in a semiconductor device in accordance with the preferred embodiment of the present invention.
Figure 3:
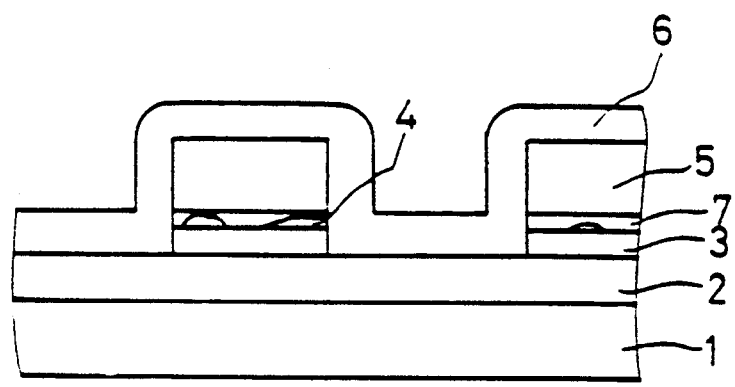
FIG. 3 is a cross-sectional view showing the method of forming a polycide interconnection in a semiconductor device in accordance with the preferred embodiment of the present invention.

FIGS. 1 to 3 are cross-sectional views showing main steps of a method of forming a polycide interconnection in a semiconductor device in accordance with a preferred embodiment of the present invention. The manufacturing process will be described below, referring to FIGS. 1 to 3.

An interlayer insulating film 2 is formed on a semiconductor substrate 1. A first polycrystal silicon film 3 is formed on the interlayer insulating film 2 by a vacuum CVD technique. At this time, a natural oxide film 4 is formed sparsely on the surface of the first polycrystal silicon film 3, as shown in FIG. 1.

Then, sputtering technique is conducted within a sputtering device, the inside (vessel) of which is in the state of vacuum, thereby a second polycrystal silicon film 7 having a film thickness of equal to or more than 400 Å is deposited on the first polycrystal silicon film 3, as shown in FIG. 2. AS can be seen, the natural oxide film 4 exists on the surface of the first polycrystal silicon film 3.

The same sputtering device that is employed to deposit the second polycrystal silicon film 7 is employed also in the next step. After the second polycrystal silicon film 7 is formed, the inside (vessel) of the sputtering device is maintained to be in the state of vacuum. Another sputtering technique is conducted within the vacuum sputtering device to deposit a metal silicide having a high fusing point such as a tungsten silicide, for example, on the second polycrystal silicon film 7, as shown in FIG. 2, thereby a metal silicide film 5 is formed on the second polycrystal silicon film 7.

Then, the first and the second polycrystal silicon films 3 and 7 and the metal silicide film 5 are patterned by photolithography and etching process to form a polycide interconnection composed of the first and the second polycrystal silicon films 3 and 7 and the metal silicide film 5, as shown in FIG. 3. Further, a silicon oxide film is formed on the entire surface by a thermal oxidation technique to be an interlayer insulating film 6.

The second polycrystal silicon film 7 and the metal silicide film 5 are thus continuously formed by the sputtering technique within the same vacuum vessel. Consequently, a natural oxide film is not formed on the surface of the second polycrystal silicon film 7, i.e. the boundary face between the second polycrystal silicon film 7 and the metal silicide film 5.

FIG. 4 explanatorily illustrates relations between a film thickness of the second polycrystal silicon film 7 and condition of the boundary face between the metal silicide film 5 and the second polycrystal silicon film 7. As can be seen in the figure, when the film thickness of the second polycrystal silicon film 7 is equal to or more than 400 Å, the second polycrystal silicon film 7 and the metal silicide film 5 are not separated at the boundary face even when the natural oxide film 4 remains on the surface of the first polycrystal silicon film 3. This is the same result achieved with the conventional process wherein the natural oxide film is removed by the sputter etching.

After the metal silicide film 5 is formed, the interlayer insulating film 6 is formed on the metal silicide film 5 by the thermal oxidation technique which involves a heat processing at a high temperature. When the film thickness of the second polycrystal silicon film 7 is equal to or more than 400 Å, the greater part of silicon in the second polycrystal silicon film to be oxidized is uniformly supplied from the second polycrystal silicon film 7 to the surface of the metal silicide film 5 in forming the interlayer insulating film 6. Therefore, it can be presumed that the natural oxide film 4 remaining on the boundary face between the first and the second polycrystal silicon films 2 and 3 affects little.

Figure 5:
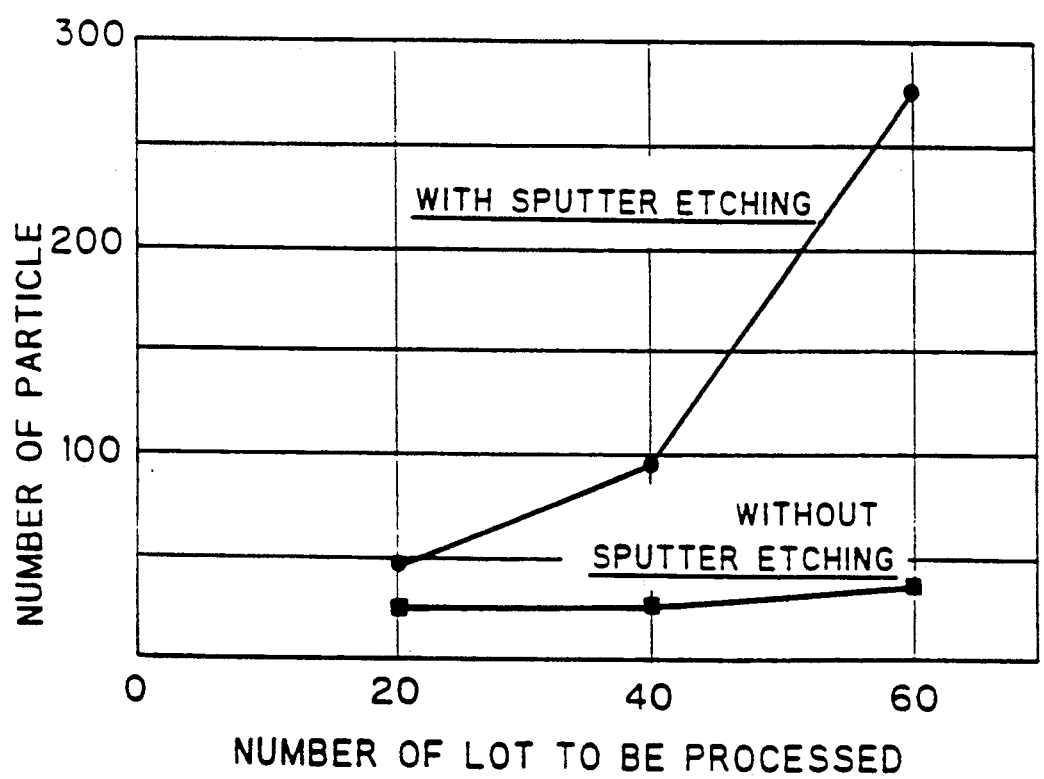
FIG. 5 illustrates graphs for showing the effect to be obtained in the preferred embodiment shown in FIGS. 1 to 3.
Figure 6:
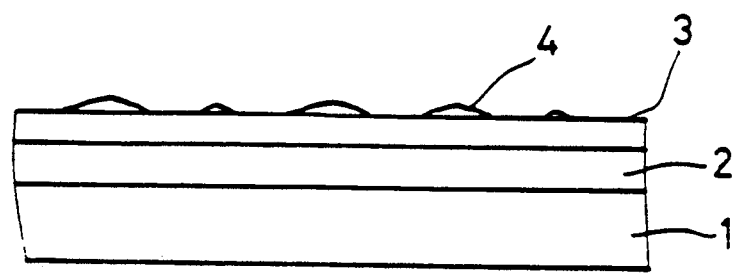
FIG. 6 is a cross-sectional view showing a conventional method of forming a polycide interconnection in a semiconductor device.
Figure 7:
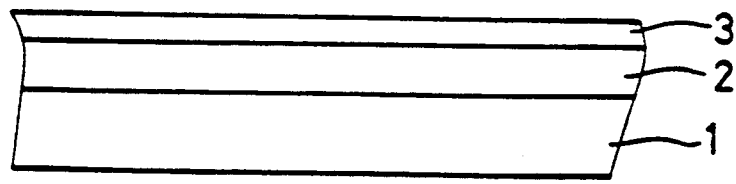
FIG. 7 is a cross-sectional view showing the conventional method of forming a polycide interconnection in a semiconductor device.
Figure 8:
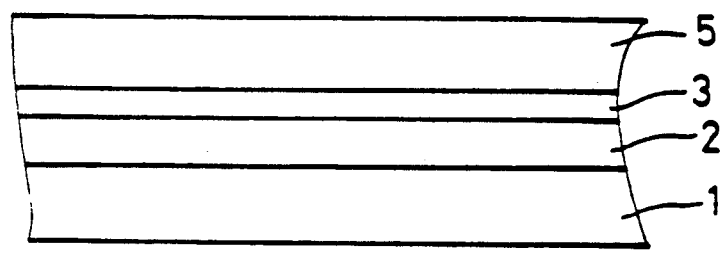
FIG. 8 is a cross-sectional view showing the conventional method of forming a polycide interconnection in a semiconductor device.
Figure 9:
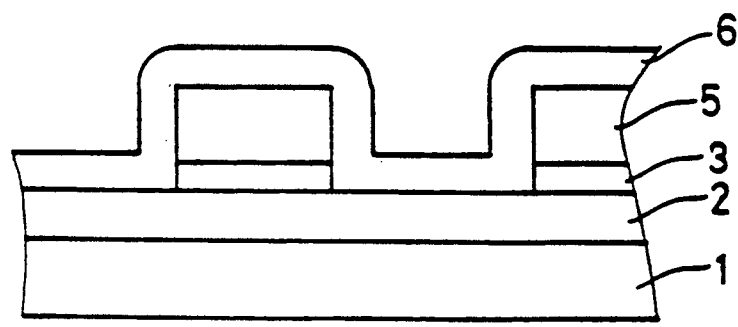
FIG. 9 is a cross-sectional view showing the conventional method of forming a polycide interconnection in a semiconductor device.

FIG. 5 illustrates graphs showing the respective numbers of particles (foreign material of more than 1 μm) to be produced per semiconductor chip in two cases; the case of conducting the sputter etching for removing the natural oxide film 4 formed on the first polysilicon film 3, and the case of not conducting the sputter etching. According to the present preferred embodiment, the sputter etching is not performed, since there is not a natural oxide film to be removed. As can be seen from FIG. 5, particles to be produced in the present preferred embodiment are controlled to be small in number regardless of the number of lots to be processed, in comparison with the particles to be produced with the conventional method which involves the sputter etching. Therefore, product yield rate is improved in the present preferred embodiment.

Further, similar to the conventional method, the polycrystal silicon film to be formed directly on the interlayer insulating film 2 is the first polycrystal silicon film 3 which is formed by the CVD technique. Therefore, the layer under the polycrystal silicon film 3, i.e., the interlayer insulating film 2, is not damaged in forming the polycrystal silicon films 3 and 7.

While the invention has been shown and described in detail, the foregoing description is in all aspects illustrative and not restrictive. It is therefore understood that numerous modifications and variations can be devised without departing from the scope of the invention.

I claim:

1. A method of manufacturing a semiconductor device, comprising:
   (i) preparing a semiconductor substrate;
   (ii) forming a first polycrystal silicon film on said semiconductor substrate by a CVD technique;
   (iii) forming a second polycrystal silicon film on said first polycrystal silicon film by a sputtering technique within a vacuum vessel; and
   (iv) forming a silicide film on said second polycrystal silicon film by a sputtering technique which is conducted within said vacuum vessel to be continuous with said step (iii);
   to form a polycide structure composed of said first and second polycrystal silicon films and said silicide film.

2. A method of manufacturing a semiconductor device in accordance with claim 1, further comprising:
   (v) forming a polycide interconnection layer by patterning said first and second polycrystal silicon films and said silicide film after said fourth step (iv).

3. A method of manufacturing a semiconductor device in accordance with claim 2, further comprising:
   (vi) forming a silicon oxide film on an entire surface by a thermal oxidation technique after said fifth step (v).

4. A method of manufacturing a semiconductor device in accordance with claim 1, wherein:
   a film thickness of said second polycrystal silicon film formed in said step (iii) is equal to or more than 400 Å.

5. A method of manufacturing a semiconductor device in accordance with claim 1, wherein:
   said silicide film is a metal silicide having a high fusing point.

* * * * *